United States Patent
Huang

(10) Patent No.: US 7,193,909 B2
(45) Date of Patent: Mar. 20, 2007

(54) SIGNAL PROCESSING CIRCUITS AND METHODS, AND MEMORY SYSTEMS

(75) Inventor: Hsiang-I Huang, Hsinchu (TW)

(73) Assignee: Mediatek Inc., Hsinchu (TW)

( * ) Notice: Subject to any disclaimer, the term of this patent is extended or adjusted under 35 U.S.C. 154(b) by 164 days.

(21) Appl. No.: 11/120,517

(22) Filed: May 2, 2005

(65) Prior Publication Data

US 2006/0245276 A1   Nov. 2, 2006

(51) Int. Cl.
*G11C 7/00* (2006.01)

(52) U.S. Cl. ...................................... 365/193
(58) Field of Classification Search ............... 365/193; 326/21, 22, 26; 327/165, 365, 379
See application file for complete search history.

(56) References Cited

U.S. PATENT DOCUMENTS

| | | | | |
|---|---|---|---|---|
| 4,034,303 A | * | 7/1977 | Kodaira | 327/115 |
| 6,477,110 B2 | * | 11/2002 | Yoo et al. | 365/233 |
| 6,782,486 B1 | * | 8/2004 | Miranda et al. | 713/601 |
| 6,785,189 B2 | | 8/2004 | Jacobs et al. | 365/233 |
| 6,822,478 B2 | * | 11/2004 | Elappuparackal | 326/46 |
| 7,068,080 B1 | * | 6/2006 | Sanders | 327/99 |
| 7,123,524 B1 | * | 10/2006 | Han | 365/193 |
| 7,131,092 B2 | * | 10/2006 | Ham | 716/6 |

* cited by examiner

*Primary Examiner*—Richard T. Elms
*Assistant Examiner*—Alexander Sofocleous
(74) *Attorney, Agent, or Firm*—Thomas, Kayden, Horstemeyer & Risley

(57) ABSTRACT

A signal processing circuit. A first flip flop samples a reference signal by rising edges of the data strobe signal, and outputs a first sampling signal. A second flip flop samples the first sampling signal by falling edges of the data strobe signal, and outputs a second sampling signal. An OR logic gate is coupled to the first sampling signal, the second sampling signal, and the reference signal to generate a logic signal. A clock gating circuit generates a modified data strobe signal according to the data strobe signal and the logic signal.

12 Claims, 4 Drawing Sheets

SIGNAL PROCESSING CIRCUITS AND METHODS, AND MEMORY SYSTEMS

BACKGROUND

The disclosure relates in general to signal processing circuits and methods for source synchronization. In particular, the disclosure relates to signal processing circuits and methods for a double data rate (DDR) synchronous dynamic random access memory (SDRAM).

Certain types of memory devices generate a clock strobe signal having edges aligned with changes in the read data. A DDR SDRAM transfers data on each rising and falling edge of the clock strobe signal, thereby transferring two data words per clock cycle.

A read data synchronization circuit is often used to coordinate the transfer of data to and from a memory device, such as a DDR SDRAM. The read data synchronization circuit provides a local clock signal to the memory device to synchronize read and write operations. The clock strobe signal generated by the memory device with the read data has predefined phase constraints with respect to the local clock signal provided by the read data synchronization circuit. The read data synchronization circuit uses the clock strobe signal to determine when the read data is valid and can therefore be latched. The times at which the read data is latched are preferably synchronized relative to the clock strobe signal so as to latch the read data in the middle of the valid data window.

In normal operation, the memory controller can initiate a READ operation by issuing a READ command to the DDR SDRAM. In response, the DDR SDRAM will retrieve a predetermined portion of the data stored therein beginning at the particular address specified in the READ command. When ready to transmit the retrieved data, the DDR SDRAM will first generate the DQS preamble, then transmit the data, edge-aligned with both the rising and falling edges of DQS, and, finally, generate the DQS postamble. This sequence, however, is problematic when noise is introduced into the DQS signal. The memory controller can be operative to mistakenly receive the noise introduced DQS signal and consider the noise introduced DQS signal as the real DQS. The memory controller reacts prematurely and captures spurious data. In the other words, it fails to receive the actual data. If DQS is introduced the noise generating from problems of, the system PCB, interference of other signals, or DDR memory, some state machines will enter a false state and system crash due to abnormal access of memory.

This particular problem becomes increasingly serious as system clock rates rise in subsequent generations of DDR devices. Given the inherent difficulty in coordinating two electronic circuits physically located on separate chips, e.g., the DDR SDRAM and the memory controller, there may be no completely satisfactory solution for such inter-chip transactions, short of using the mixed-signal clock forwarding/recovery techniques common in high-speed telecommunication devices. A alternative solution is required to improve noise immunity in systems having DDR SDRAMs.

U.S. Pat. No. 6,785,189 to Jacobs provides a method and apparatus for improving noise immunity in a DDR SDRAM system. FIG. 1 is a block diagram disclosed by Jacobs.

Jacobs discloses a DQS qualifying circuit to frame the DQS from DDR SDRAM. The DQSQ frame generator 12 includes 2 dedicated pins and a dummy load, which should be equal to the load of DDR SDRAM. The DQSQ frame generator 12 transmits a DQS qualifying signal DQSQ from one pin, and receives a delayed DQS qualifying signal from existing controller circuits 14 after a certain fly time on PC board, equal to the fly time of DQS signal. Thus, the memory controller of Jacobs uses the delayed DQS qualifying signal to frame the DQS signal from DDR SDRAM 16.

SUMMARY

An embodiment of a signal processing circuit comprises a first flip flop operative to sample a reference signal by rising edges of the data strobe signal, and output a first sampling signal, a second flip flop operative to sample the first sampling signal by falling edges of the data strobe signal, and output a second sampling signal, an OR logic gate coupled to the first sampling signal, the second sampling signal, and the reference signal, generating a logic signal, a clock gating circuit operative to generate a modified data strobe signal according to the data strobe signal and the logic signal.

An embodiment of a memory system comprises a memory device operative to output data and a data strobe signal synchronized with the data according to a memory access request, a signal processing circuit comprising a first flip flop operative to sample a reference signal by rising edges of the data strobe signal, and output a first sampling signal, a second flip flop operative to sample the first sampling signal by falling edges of the data strobe signal, and output a second sampling signal, an OR logic gate coupled to the first sampling signal, the second sampling signal, and the reference signal for generating a logic signal, a clock gating circuit operative to generate a modified data strobe signal according to the data strobe signal and the logic signal, and a memory controller operative to provide the memory access request and sample the data using the modified data strobe signal.

An embodiment of a signal processing method comprises sampling a reference signal by rising edges of the data strobe signal, and outputting a first sampling signal, sampling the first sampling signal by falling edges of the data strobe signal, and outputting a second sampling signal, performing an OR logic operation on the first sampling signal, the second sampling signal, and the reference signal to generate a logic signal, and generating a modified data strobe signal according to the logic levels of the data strobe signal and the logic signal.

BRIEF DESCRIPTION OF THE DRAWINGS

The signal processing circuits and methods, and memory systems will become more fully understood from the detailed description, given herein below, and the accompanying drawings. The drawings and description are provided for purposes of illustration only and, thus, are not intended to be limiting of the present invention.

DETAILED DESCRIPTION

Figure 1:
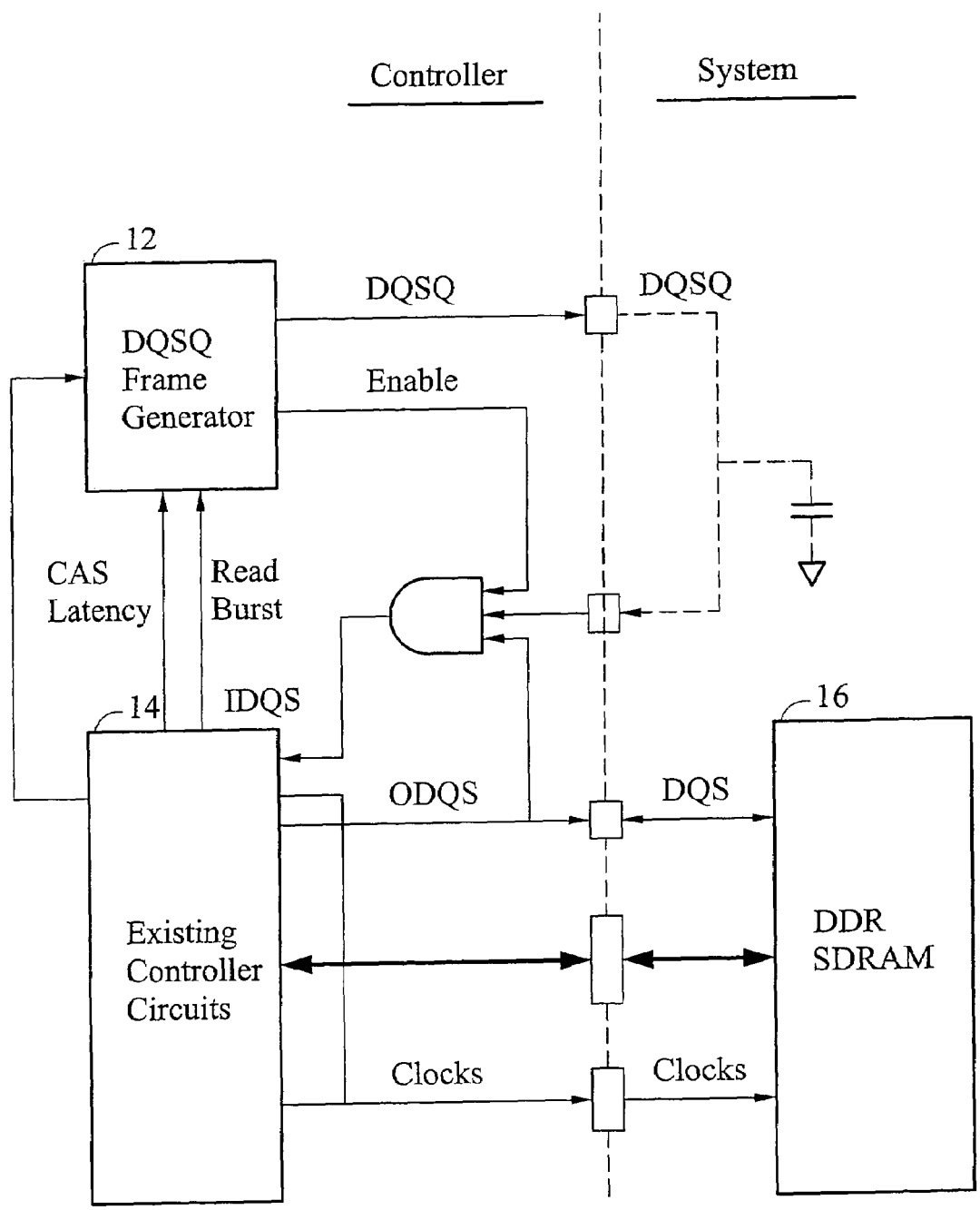
FIG. 1 is a conventional memory controller.
Figure 2:
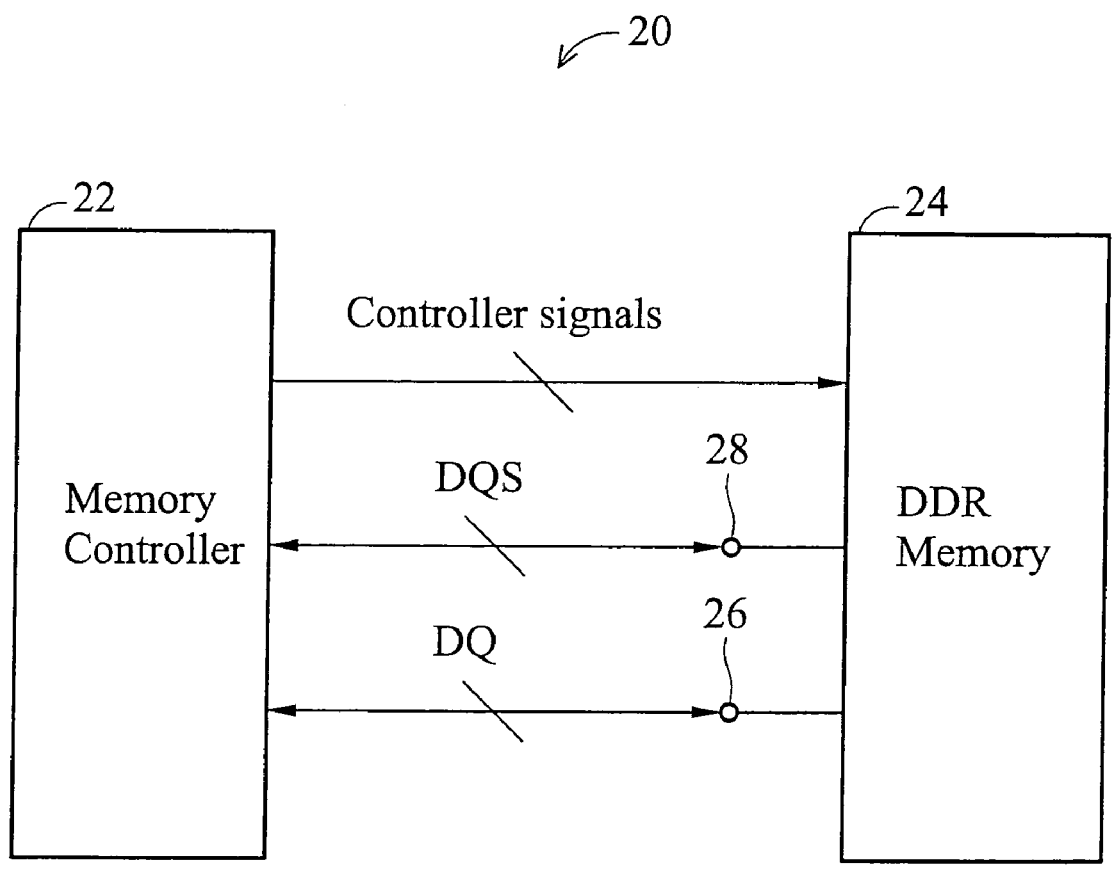
FIG. 2 is a block diagram of a memory system 20, comprising memory controller 22 and DDR memory 24.

FIG. 2 is a block diagram of a memory system 20, comprising a memory controller 22 and a DDR memory 24. Memory controller 22 issues READ or WRITE commands to DDR memory through multiple control signals. After receiving the READ commands, DDR memory 24 drives multiple data DQ and data strobe DQS respectively from DQ port 26 and DQS port 28 to memory controller 22. Memory controller 22 uses DQS to sample signal DQ to obtain read memory data. Normally, one DQS signal samples 4 or 8 DQ signals.

Figure 3:
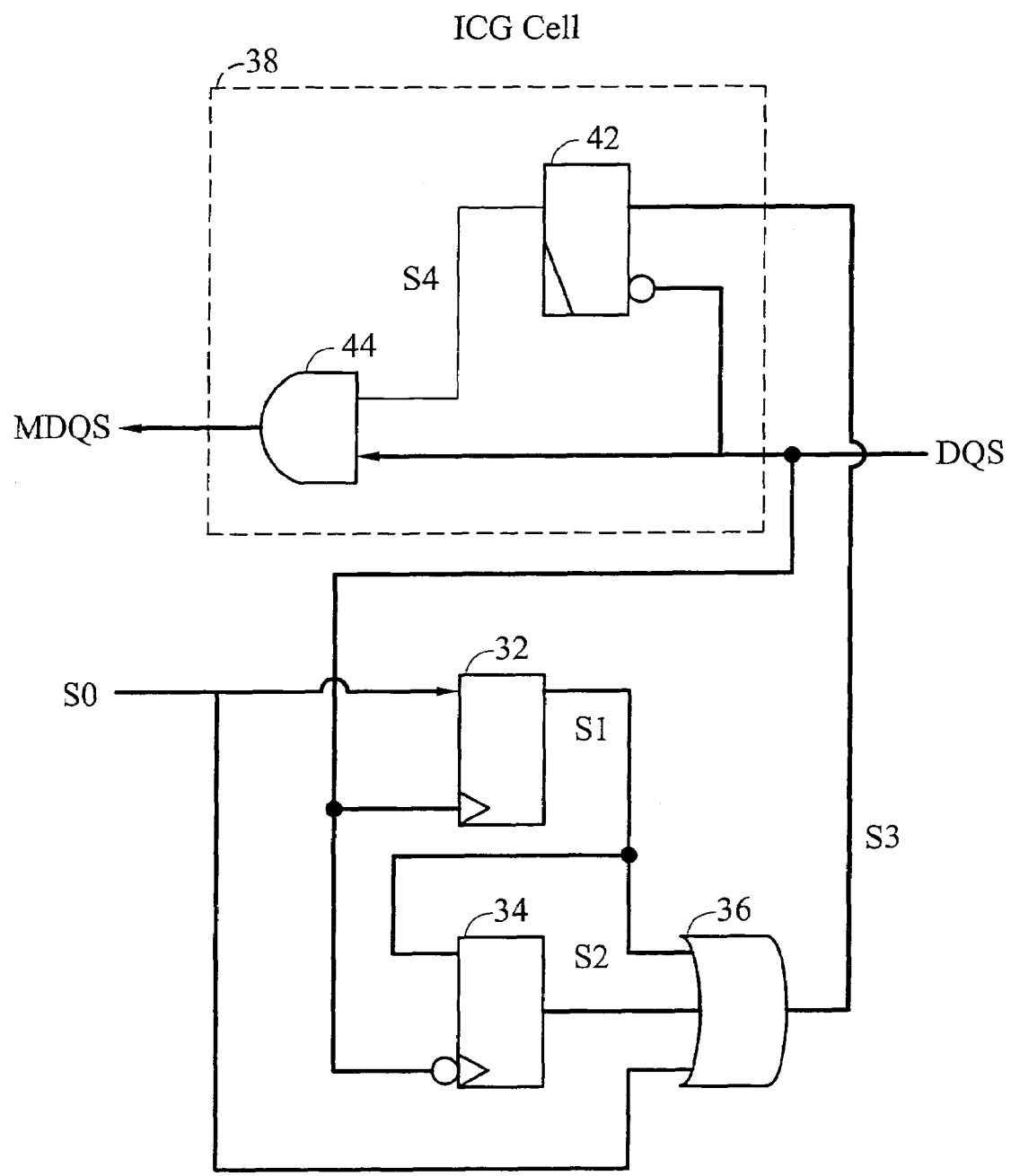
FIG. 3 is a block diagram of a signal processing circuit according to an embodiment.
Figure 4:
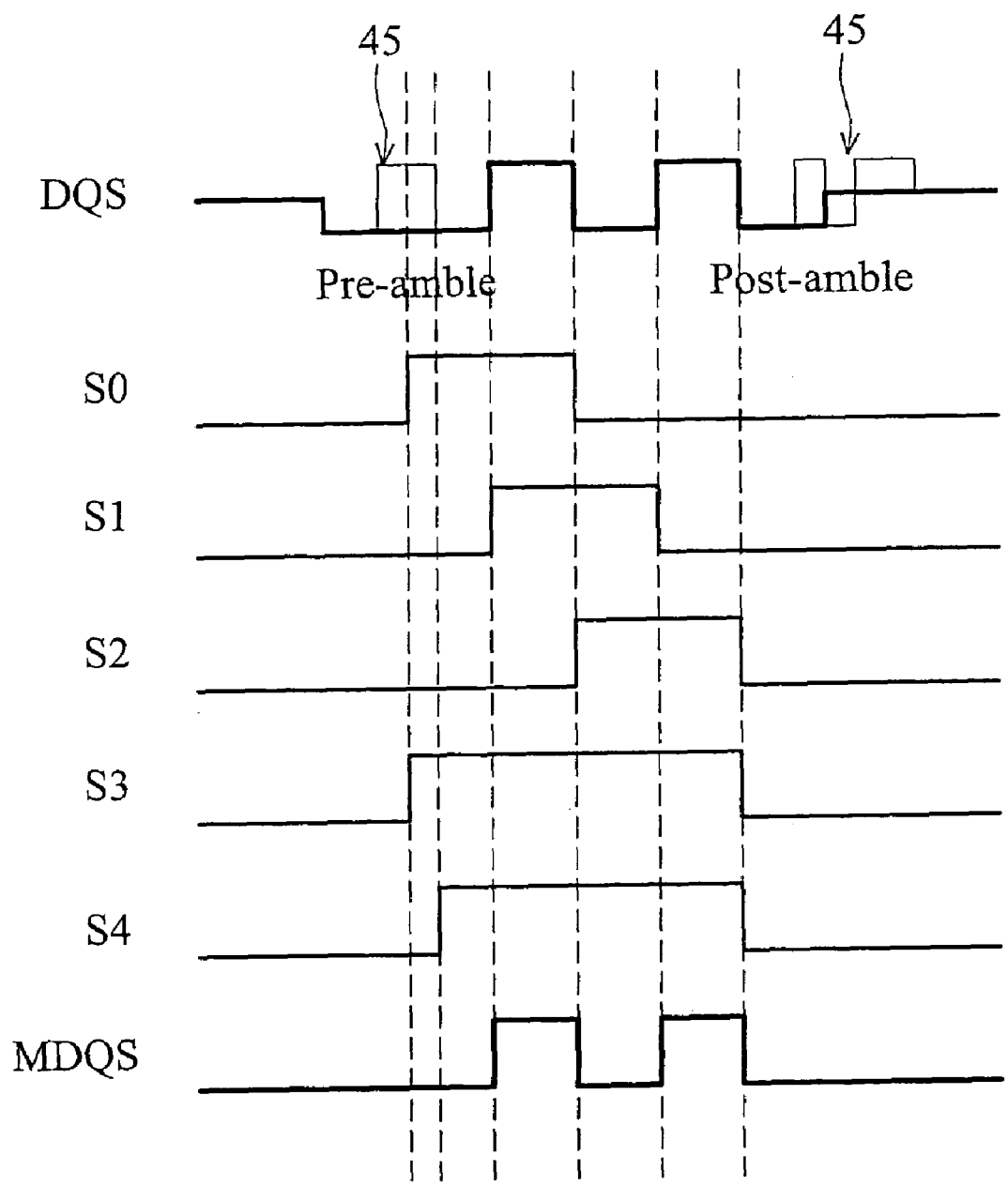
FIG. 4 is a timing diagram of the signal processing circuit according to an embodiment.

FIG. 3 is a block diagram of a signal processing circuit processing a data strobe DQS output by DDR memory 24 according to an embodiment of the invention. FIG. 4 is a timing diagram of the signal processing circuit according to an embodiment of the invention. It is assumed that there is noise in data strobe DQS. During read cycles, DDR memory 24 drives data DQ and data strobe DQS to memory controller 22. Noise 45 may be induced during DQS pre-amble or/and post-amble, as shown in FIG. 4.

A first flip flop 32 samples a reference signal S0 by rising edges of the data strobe DQS, and outputs a first sampling signal S1. Specifically, first sampling signal S1 is asserted by rising edges of data strobe DQS when reference signal S0 is at high logic level, and deasserted by rising edges of data strobe DQS when reference signal S0 is at high logic level. In an embodiment of the invention, reference signal S0 is provided by memory controller 22 according to a column address strobe (CAS) latency.

A second flip flop 34 samples first sampling signal S1 by falling edges of data strobe DQS, and outputs a second sampling signal S2. Specifically, second sampling signal S2 is asserted by falling edges of data strobe DQS when first sampling signal S1 is at high logic level, and deasserted by falling edges of data strobe DQS when first sampling signal S1 is at high logic level. An OR logic gate 36 is coupled to first sampling signal S1, second sampling signal S2, and reference signal S0, performing an OR logic operation on first sampling signal S1, second sampling signal S2, and reference signal S0 to generate a logic signal S3. A clock gating circuit 38 generates a modified data strobe MDQS according to data strobe DQS and logic signal S3. In an embodiment of the invention, clock gating circuit 38 is an integrated clock gating cell.

Clock gating circuit 38 comprises a latch circuit 42 and an AND logic gate 44. Latch circuit 42, coupled to logic signal S3, outputs a latched signal S4 with a logic level corresponding to logic signal S3 when data strobe DQS is at a predetermined logic level. Specifically, logic signal S3 passes through latch circuit 42 first, and is output as latched signal S4 when data strobe DQS is at low logic level.

An AND logic gate 44, coupled to latched signal S4 and data strobe DQS, outputs the modified data strobe MDQS by performing an AND logic operation on latched signal S4 and data strobe DQS. Thus, a modified data strobe MDQS is generated. As shown in FIG. 4, noise 45 during DQS pre-amble or/and post-amble is removed.

Accordingly, the signal processing circuit according to the invention removes the noise exist in data strobe DQS without the need for extra pins, acceptable for most PAD-limited ASICs. In addition, the signal processing circuit according to the invention reduces hardware costs and space requirements. In addition, the circuit disclosed in the embodiments of the invention can be utilized in other types of source synchronous bus, such as 1394 bus, Universal Serial Bus (USB), Advanced Technology Attachment (ATA), or Accelerated Graphics Port (AGP) interface.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A signal processing circuit for a data strobe signal output by a memory device, comprising:
   a first flip flop operative to sample a reference signal by rising edges of the data strobe signal, and output a first sampling signal;
   a second flip flop being operative to sample the first sampling signal by falling edges of the data strobe signal, and output a second sampling signal;
   an OR logic gate coupled to the first sampling signal, the second sampling signal, and the reference signal, generating a logic signal; and
   a clock gating circuit operative to generate a modified data strobe signal according to the data strobe signal and the logic signal.

2. The signal processing circuit of claim 1, wherein the clock gating circuit comprises:
   a latch circuit coupled to the logic signal, outputting a latched signal according to the logic signal and the data strobe signal; and
   an AND logic gate coupled to the latched signal and the data strobe signal, outputting the modified data strobe signal.

3. The signal processing circuit of claim 2, wherein the latch circuit outputs the latched signal with a logic level corresponding to the logic signal when the data strobe signal is in a low logic level.

4. The signal processing circuit of claim 1, wherein the reference signal is generated according to a column address strobe signal.

5. A memory system, comprising:
   a memory device operative to output data and a data strobe signal synchronized with the data according to a memory access request;
   a signal processing circuit comprising:
      a first flip flop operative to sample a reference signal by rising edges of the data strobe signal, and output a first sampling signal;
      a second flip flop operative to sample the first sampling signal by falling edges of the data strobe signal, and output a second sampling signal;
      an OR logic gate coupled to the first sampling signal, the second sampling signal, and the reference signal to generate a logic signal; and
      a clock gating circuit operative to generate a modified data strobe signal according to the data strobe signal and the logic signal; and
   a memory controller operative to provide the memory access request, and sample the data using the modified data strobe signal.

6. The memory system of claim 5, wherein the clock gating circuit comprises:
   a latch circuit coupled to the logic signal, outputting a latched signal according to the logic signal and the data strobe signal; and
   an AND logic gate coupled to the latched signal and the data strobe signal, outputting the modified data strobe signal.

7. The memory system of claim 6, wherein the latch circuit outputs the latched signal with a logic level corresponding to the logic signal when the data strobe signal is at a low logic level.

8. The memory system of claim 5, wherein the signal processing circuit is located in the memory controller.

9. The memory system of claim 5, wherein the signal processing circuit is located outside the memory controller.

10. A signal processing method for a memory device outputting data and a data strobe signal synchronized with the data according to a memory access request, comprising:
   sampling a reference signal by rising edges of the data strobe signal, and outputting a first sampling signal;
   sampling the first sampling signal by falling edges of the data strobe signal, and outputting a second sampling signal;
   performing an OR logic operation on the first sampling signal, the second sampling signal, and the reference signal to generate a logic signal; and
   generating a modified data strobe signal according to the logic levels of the data strobe signal and the logic signal.

11. The signal processing method of claim 10, further comprising:
   latching the logic signal;
   outputting a latched signal according to the logic level of the data strobe signal; and
   performing an AND logic operation on the latched signal and the data strobe signal to output the modified data strobe signal.

12. The signal processing method of claim 11, wherein the logic level of the latched signal is corresponding to the logic signal when the data strobe signal is at a low logic level.

* * * * *